(12) United States Patent
Chen et al.

(10) Patent No.: US 9,337,834 B2
(45) Date of Patent: May 10, 2016

(54) CMOS INPUT BUFFER CIRCUIT

(71) Applicant: China Electronic Technology Corporation, 24th Research Institute, Chongqing (CN)

(72) Inventors: Xi Chen, Chongqing (CN); Gang-Yi Hu, Chongqing (CN); Xue-Liang Xu, Chongqing (CN); Xing-Fa Huang, Chongqing (CN); Liang Li, Chongqing (CN); Xiao-Feng Shen, Chongqing (CN); Ming-Yuan Xu, Chongqing (CN); Lei Zhang, Chongqing (CN); Yan Wang, Chongqing (CN); Rong-Ke Ye, Chongqing (CN); You-Hua Wang, Chongqing (CN); Xu Huang, Chongqing (CN); Jiao-Xue Li, Chongqing (CN)

(73) Assignee: CHINA ELECTRONIC TECHNOLOGY CORPORATION, 24TH RESEARCH INSTITUTE, Chongqing (CN)

( * ) Notice: Subject to any disclaimer, the term of this patent is extended or adjusted under 35 U.S.C. 154(b) by 246 days.

(21) Appl. No.: 14/355,580
(22) PCT Filed: Nov. 19, 2012
(86) PCT No.: PCT/CN2012/084832
§ 371 (c)(1),
(2) Date: Apr. 30, 2014
(87) PCT Pub. No.: WO2014/075314
PCT Pub. Date: May 22, 2014

(65) Prior Publication Data
US 2015/0102848 A1   Apr. 16, 2015

(30) Foreign Application Priority Data
Nov. 14, 2012   (CN) .......................... 2012 1 0455598

(51) Int. Cl.
H03K 17/687   (2006.01)
H03K 19/00    (2006.01)
H03K 19/017   (2006.01)
H03K 19/0185  (2006.01)
H03K 19/003   (2006.01)
H03K 19/094   (2006.01)

(52) U.S. Cl.
CPC ........ *H03K 19/0005* (2013.01); *H03K 19/0013* (2013.01); *H03K 19/00361* (2013.01); *H03K 19/01714* (2013.01); *H03K 19/018521* (2013.01); *H03K 19/09432* (2013.01)

(58) Field of Classification Search
CPC .................................................. H03K 17/687
See application file for complete search history.

(56) References Cited

U.S. PATENT DOCUMENTS

| 4,698,526 A * | 10/1987 | Allan ............... H03K 19/01721 326/103 |
| 5,668,483 A | 9/1997 | Roohparvar |
| 6,469,562 B1 * | 10/2002 | Shih ........................ H03F 1/301 327/307 |

FOREIGN PATENT DOCUMENTS

| CN | 101013889 A | 8/2007 |
| CN | 102771052 A | 11/2012 |

*Primary Examiner* — Hai L Nguyen
(74) *Attorney, Agent, or Firm* — Cheng-Ju Chiang

(57) ABSTRACT

A high-linearity CMOS input buffer circuit is provided for neutralizing non-linearity of follower circuits' transconductance and output impedance resulting from input signals' variation. In doing so, the linearity of CMOS input buffer is improved. The buffer circuit includes a CMOS input follower circuit, a linearity improvement circuit of follower transistor, a current source load, and a linearity improvement circuit of load impedance. The buffer circuit is fabricated in standard CMOS process, featuring low cost, simplicity and strong linearity at high frequency. It has wide applications in analog and hybrid analog-digital CMOS ICs requiring high linearity input buffer.

9 Claims, 5 Drawing Sheets

CMOS INPUT BUFFER CIRCUIT

CROSS REFERENCE TO RELATED APPLICATIONS

The present application is a 35 U.S.C. §371 National Phase conversion of International (PCT) Patent Application No. PCT/CN2012/084832, filed on Nov. 19, 2012, the disclosure of which is incorporated by reference herein. The PCT International Patent Application was filed in Chinese.

1. FIELD OF THE INVENTION

The invention relates to a Complementary Metal Oxide Semiconductor (CMOS) input buffer circuit, particularly to one based on linearity compensation technology, requiring high linearity input buffers for applications in analog and digital-analog hybrid Ics.

2. DESCRIPTION OF RELATED ART

A high-linearity CMOS input buffer circuit is part of CMOS analog and digital-analog hybrid ICs. As the circuit serves as an interface unit for signal inputs and processing circuits, its linearity determines holistic accuracy of systems.

The traditional input buffer circuit usually employs Bipolar Junction Transistor (BJT) technology with emitter follower. As CMOS technology emerges and prevails, CMOS input buffer circuit with source follower has increasingly become a substitute for BJT input buffer circuit. As shown in FIG. 1, CMOS technology features much more assets than bipolar technology does. That being said, CMOS technology has lower input transconductance, lower output impedance, and least desirably worse parasitic effects resulting in visible non-linearity. Accordingly, CMOS input buffer circuit features lower linearity than conventional one does. Linearity improvement technologies for BJT input buffer does not work for CMOS type. So CMOS input buffer circuit turns to increasing current value of tail current transistor as a way of improving input transconductance, which results in bigger size of layout and much more holistic power consumption.

Therefore, there exists a pressing need for high-linearity CMOS input buffer circuit that can meet and exceed expectations of CMOS analog and digital-analog hybrid ICs.

BRIEF SUMMARY OF THE INVENTION

It is an object of the invention to provide linearity improvement technology for CMOS input buffer circuit. The disclosure solves problems associated with non-linearity of the circuit, low input transconductance and low output impedance.

The foregoing objects of the invention are accomplished as follows:

The invention provides a CMOS input buffer circuit comprising a CMOS input follower circuit, a linearity improvement circuit of follower transistor, a current source load and a linearity improvement circuit of load impedance, wherein:

the CMOS input follower circuit, for following changes of input signals and outputting follower input signals;

the linearity improvement circuit of follower transistor, for obtaining changes of input signals and giving feedback to CMOS input follower circuit;

the current source load, for providing a bias current for CMOS input follower circuit;

the linearity improvement circuit of load impedance, being placed between CMOS input follower circuit and current source load, for enhancing absolute load impedance of current source and restraining its fluctuation so as to improve load impedance linearity of CMOS input buffer.

Then, said CMOS input follower circuit comprises M0 NMOS transistor. The gate of M0 NMOS transistor serves as the input end of CMOS input follower circuit, while the source serves as the output end. Said linearity improvement circuit of follower transistor is set between the gate and drain of M0 NMOS transistor. One end of said linearity improvement circuit of load impedance is connected to the source of M0 NMOS transistor, with the other end being connected to current source load.

Then, said linearity improvement circuit of follower transistor comprises capacitor C1 and M1 NMOS transistor. One end of said capacitor C1 is connected to the gate of M0 NMOS transistor with the other end being connected to the gate of M1 NMOS transistor. The drain and source of M1 NMOS transistor are respectively connected to power supply and the drain of M0 NMOS transistor.

Then, said linearity improvement circuit of follower transistor comprises M4 PMOS transistor and M1 NMOS transistor. The gate and source of said M4 PMOS transistor are respectively connected to the drain and source of M0 NMOS transistor. The gate of M1 NMOS transistor is connected to bias voltage. The drain of M4 PMOS transistor is connected to power supply.

Then, said current source load comprises M3 NMOS transistor. The gate of M3 NMOS is connected to bias voltage. The source is grounded and the drain is connected to the linearity improvement circuit of load impedance.

Then, said linearity improvement circuit of load impedance comprises M2 NMOS transistor and an operational amplifier. The drain and source of said M2 NMOS transistor are respectively connected to the source of M0 NMOS transistor and the drain of M3 NMOS transistor. The input end of said operational amplifier is connected to the drain of M3 NMOS transistor, and its output end is connected to the gate of M2 NMOS transistor.

Then, said linearity improvement circuit of load impedance comprises M2 NMOS transistor and M4 NMOS transistor. The source of M2 NMOS transistor is connected to the drain of M4 NMOS transistor. The source of M4 NMOS transistor is connected to the drain of M3 NMOS transistor. The gates of M2 NMOS transistor and M4 NMOS transistor are connected to bias voltage.

Then, PMOS transistors are substituted for said NMOS transistors.

Then, said PMOS transistors are replaced by NMOS transistors.

Comparing with traditional input buffer circuits, the invention has following advantages.

1. All devices that the invention employs are fabricated in standard CMOS process, in ways that facilitate its realization with low cost and wide applications.

2. The invention achieves remarkable improvements on linearity of CMOS input buffer circuit. The circuit boasts better linearity improvement technologies than conventional one does, which slows deterioration of linearity as input signals increase. The circuit features better performance at high frequency.

3. Comparing with conventional linearity improvement circuits, the invention features simpler structure. A fewer devices are required to improve the linearity of the circuit. All result in fewer modifications for the circuit layout. The circuit saves at most 70% of power consumption.

DETAILED DESCRIPTION OF THE INVENTION

Hereinafter, the preferred embodiments of the present invention will be described with the accompanying drawings. It should be understood that the following embodiments are provided just for describing the invention, instead of limiting the property protection scope of the invention.

Embodiment 1

Figure 1:
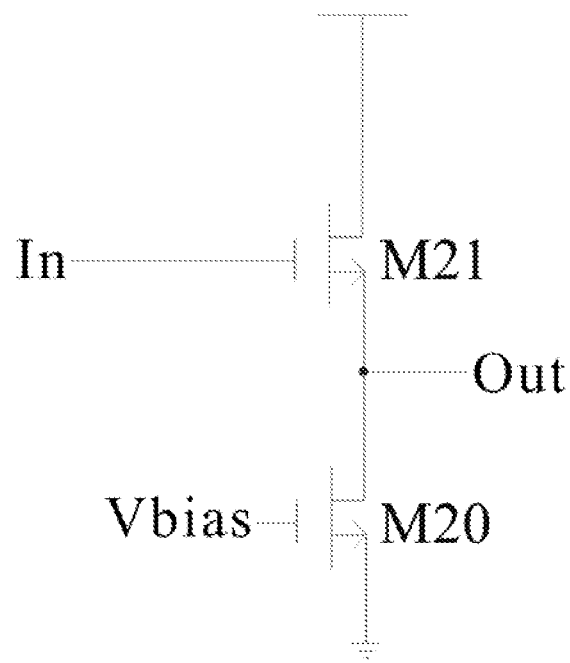
FIG. 1 is a conventional CMOS input buffer circuit.
Figure 2:
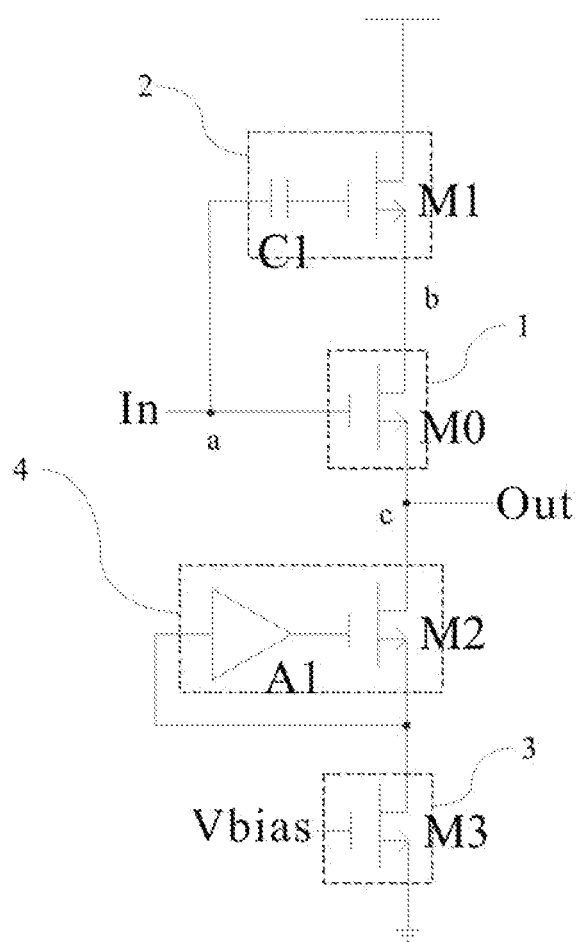
FIG. 2 is preferred embodiment 1 of the invention.

As shown in FIG. 2, a CMOS input buffer circuit includes a CMOS input follower circuit, a linearity improvement circuit of follower transistor, a current source load, and a linearity improvement circuit of load impedance.

The CMOS input follower circuit follows changes of input signals and outputs follower input signals. The CMOS input follower circuit includes a M0 NMOS (N-Channel MOS) transistor. A gate of the M0 NMOS serves as an input end of the CMOS input follower circuit. A source of the M0 NMOS serves as an output end of the CMOS input follower circuit. The linearity improvement circuit of follower transistor is connected between the gate and the drain of the M0 NMOS transistor. An end of the linearity improvement circuit of load impedance is connected to the source of the M0 NMOS transistor. The other end of the linearity improvement circuit of load impedance is connected to the current source load.

The linearity improvement circuit of follower transistor (M0 NMOS transistor) obtains changes of input signals and gives feedback to the CMOS input follower circuit. The linearity improvement circuit works to neutralize non-linearity of follower transistor's transconductance and output impedance resulting from input signals' fluctuation. In doing so, the linearity of CMOS input buffer circuit is improved. The linearity improvement circuit of follower transistor includes a capacitor C1 and a NMOS transistor M1. An end of the capacitor C1 is connected to the gate of the M0 NMOS transistor. The other end of the capacitor C1 is connected to the gate of the M1 NMOS transistor. The drain and the source of the M1 NMOS transistor are respectively connected to a power supply and the drain of the M0 NMOS transistor.

Another way to realize linearity improvement of follower transistor is presented as follows. The linearity improvement circuit of follower transistor includes a M4 PMOS (Positive channel MOS) transistor and a M1 NMOS transistor. The gate and the source of the M4 PMOS transistor are respectively connected to the drain and the source of the M0 NMOS transistor. The gate of the M1 NMOS transistor is connected to a bias voltage. The drain of the M4 PMOS transistor is connected to the power supply.

The current source load provides a bias current for the CMOS input follower circuit. The current source load includes a M3 NMOS transistor. A gate of the M3 NMOS is connected to the bias voltage. A source of the M3 NMOS is grounded and a drain of the M3 NMOS is connected to the linearity improvement circuit of load impedance.

The linearity improvement circuit of load impedance, being placed between CMOS input follower circuit and current source load, enhances absolute load impedance of current source, restrains its relative fluctuation and improves load impedance linearity of CMOS input buffer. The linearity improvement circuit of load impedance includes a M2 NMOS transistor and an operational amplifier. A drain and a source of the M2 NMOS transistor are respectively connected to the source of the M0 NMOS transistor and the drain of the M3 NMOS transistor. The input end of the operational amplifier is connected to the drain of M3 NMOS transistor. And the output end of the operational amplifier is connected to the gate of the M2 NMOS transistor.

Another way to realize the linearity improvement circuit of load impedance is introduced as follows. The linearity improvement circuit of load impedance includes the M2 NMOS transistor and a M4 NMOS transistor. A source of the M2 NMOS transistor is connected to the drain of the M4 NMOS transistor. The source of the M4 NMOS transistor is connected to the drain of the M3 NMOS transistor. The gates of the M2 NMOS transistor and the M4 NMOS transistor are connected to the bias voltage.

Hereinbefore, if the PMOS transistors are substituted for all NMOS transistors, the circuit works as well. Wherein, the M4 PMOS transistor is changed into a NMOS transistor. The way of connecting devices remains unchanged.

The principles and embodiments of the high-linearity CMOS input buffer are presented as follows.

The M0 NMOS transistor, the M1 NMOS transistor, the M2 NMOS transistor, the M3 NMOS transistor, and the M4 NMOS transistor described in following embodiments are respectively tagged as the NMOS M0, the NMOS M1, the NMOS M2, the NMOS M3 and the NMOS M4. The operational amplifier is tagged as A1. The capacitor is tagged as C1.

FIG. 2 shows a holistic structure of the invention. It includes an operational amplifier A1, four MOS transistors M0, M1, M2 and M3 and a capacitor C1. The connections among devices are related as mentioned in Summary of The Invention. How it works is related as follows.

For the conventional input buffer circuit, small signal gain AV is expressed as $$A_v = \frac{r_{o1} \| r_{o2}}{r_{o1} \| r_{o2} + \frac{1}{g_m}} \quad (1)$$

Where $g_m$ is the transconductance of M0 NMOS transistor (follower transistor), $r_{o1}$ and $r_{o2}$ are respectively output resistances of M0 NMOS transistor and tail current.

As shown in equation (1), the gain of input buffer circuit is expressed by parameters of input follower transistor's transconductance $g_m$ and output resistance $r_{o1}$ and tail current's output resistance $r_{o2}$. As output signals vary with input signals, the voltage of output end changes, which results in the variation of Drain-Source Voltage (VDS) between input follower transistor and tail current transistor. Being fabricated in sub-micron process, transconductance $g_m$ and output resistance $r_{o1}$ vary evidently with the VDS variation, usually reaching 10% non-linearity.

The linearity improvement circuit of input follower transistor (M0 NMOS transistor) includes a follower capacitor C1 and a follower transistor M1. The circuit solves the problem of non-linearity resulting from Drain-Source Voltage (VDS) variation of M0 NMOS transistor. When input signal changes at node a, output signal of M0 NMOS source varies with input signal of M0 NMOS gate. One end of follower capacitor C1 is connected to input signal end, so the other end of C1 varies with input signal. And the source of follower transistor M1 varies with the gate voltage of M1 transistor. As the source of follower transistor M1 is connected to the drain of M0 NMOS transistor, both the drain and source of M0 NMOS transistor and input signal change in same direction. Besides, as capacitor features high frequency, the gate voltage of follower transistor M1 changes simultaneously with input signal on condition of high rate input signal. In doing so, the Drain-Source Voltage of M0 NMOS transistor remains unchanged due to variation of the drain and source voltage of one MOS transistor. Therefore, the non-linearity resulting from high frequent signals only arises from mismatching of MOS transistor itself. That is to say, the Drain-Source Voltage of M0 NMOS transistor remains constant when signals change at node a.

A linearity improvement circuit of load impedance includes NMOS transistor M2 and operational amplifier A1. It solves the problem of non-linearity arising from impedance variation of tail current load M3 NMOS transistor. Output impedance of tail current is increased by using the linearity improvement circuit of load impedance. High output impedance is intended to SHIELD the invention from input devices as a way of being immune to voltage variation at node c.

Accordingly, the invention provides a high linearity high frequency for CMOS input buffer circuit.

Embodiment 2

The difference between embodiment 2 and embodiment 1 is related as follows.

Figure 3:
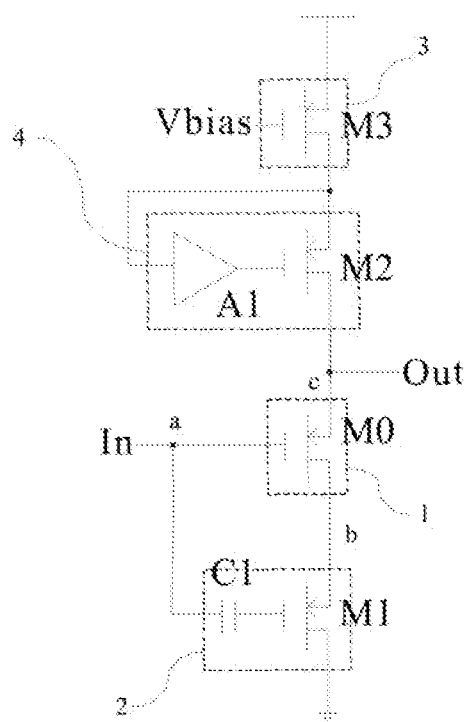
FIG. 3 is preferred embodiment 2 of the invention.

FIG. 3 is preferred embodiment 2 of high linearity CMOS input buffer.

FIG. 3 shows that M0, M1, M2 and M3 transistors are PMOS transistors in embodiment 2. As load transistor is PMOS type, impedance slightly drops. Yet, the substrate of PMOS transistor can be connected to level in ways that provide a higher linearity of input follower transistor than that in embodiment 1.

Embodiment 3

The difference between embodiment 3 and embodiment 1 is related as follows.

Figure 4:
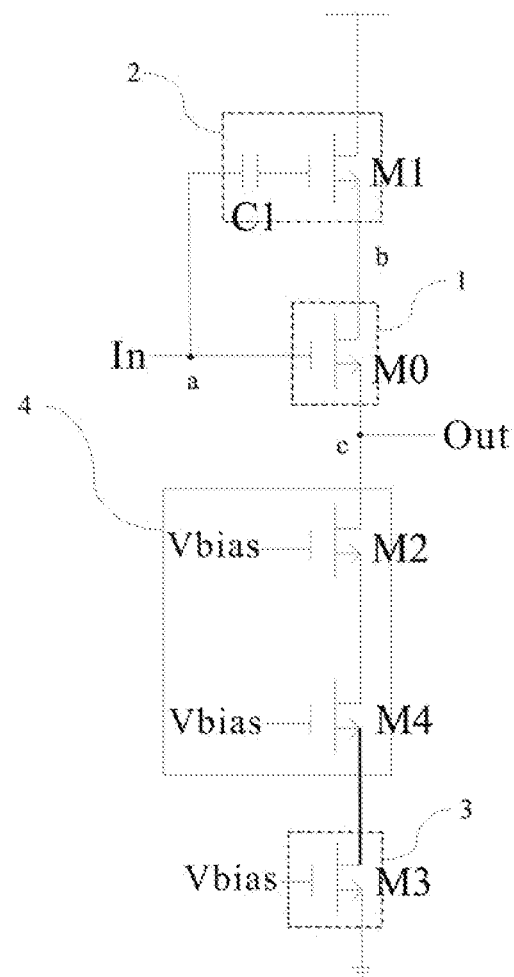
FIG. 4 is preferred embodiment 3 of the invention.

FIG. 4 is preferred embodiment 3 of high linearity CMOS input buffer.

FIG. 4 shows that operational amplifier A1 is taken out and M4 NMOS transistor is added to the circuit. The drain of M4 NMOS transistor is connected to the source of M2 NMOS transistor and the source of M4 NMOS transistor is connected to the drain of M3 NMOS transistor. The gates of M2 NMOS transistor and M4 NMOS transistor are connected to bias voltage. In doing so, power consumption drops. The M4 MOS transistor restrains output swing.

Embodiment 4

The difference between embodiment 4 and embodiment 1 is related as follows.

Figure 5:
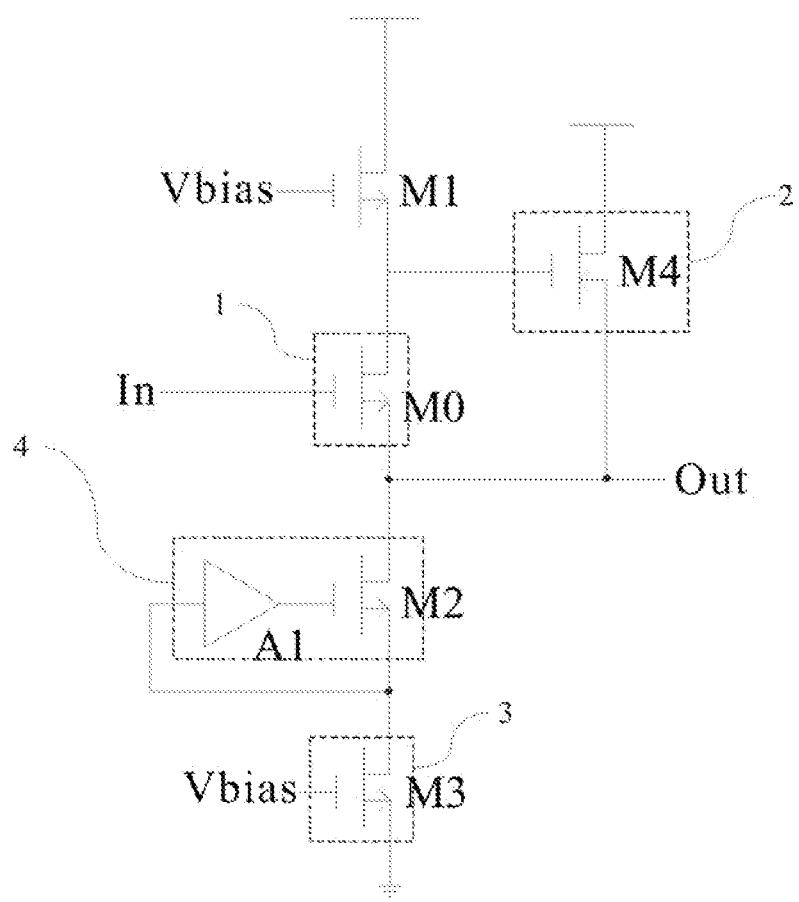
FIG. 5 is preferred embodiment 4 of the invention.

FIG. 5 is preferred embodiment 3 of high linearity CMOS input buffer.

FIG. 5 shows capacitor C1 is removed, whereas M4 PMOS transistor is added to the circuit. The gate and source of M4 PMOS transistor are respectively connected to the drain and source of M0 NMOS transistor. The gate of M1 NMOS transistor is connected to bias voltage. As capacitor C1 is removed, the circuit requires less input drive. M4 PMOS transistor, varying with input signals, compensates input follower transistor (M0 NMOS transistor). At high frequency, the circuit tends to generate harmonic wave due to time mismatch as compensated signals through M0 NMOS and M4 PMOS transistor lag behind signals through M0 NMOS transistor.

The foregoing preferred embodiments are provided to describe, not to limit, technical approaches in the present invention. Obviously, bearing the essence and concept of the present invention, technologists in this field can make various changes and redesigns to the present invention. It should be understood that those changes and redesigns are also covered by claims of the present invention, if they are with the same purpose and within the same scope of the present invention.

What is claimed is:

1. A Complementary Metal Oxide Semiconductor (CMOS) input buffer circuit, comprising a CMOS input follower circuit, a linearity improvement circuit of follower transistor, a current source load, and a linearity improvement circuit of load impedance; wherein
the CMOS input follower circuit, for following changes of input signals and outputting follower input signals;
the linearity improvement circuit of follower transistor, for obtaining changes of input signals and giving feedback to CMOS input follower circuit;
the current source load, for providing a bias current for CMOS input follower circuit;
the linearity improvement circuit of load impedance, being placed between CMOS input follower circuit and current source load, for enhancing absolute load impedance of current source, restraining its fluctuation and improving load impedance linearity of CMOS input buffer.

2. The CMOS input buffer circuit as recited in claim 1, wherein said CMOS input follower circuit comprises a M0 NMOS (N-Channel MOS) transistor, the gate of the M0 NMOS transistor serves as the input end of CMOS input follower circuit, its source as the output end, said linearity improvement circuit of follower transistor is set between the gate and drain of the M0 NMOS transistor, one end of said linearity improvement circuit of load impedance is connected to the source of M0 NMOS transistor, with the other end being connected to current source load.

3. The CMOS input buffer circuit as recited in claim 2, wherein PMOS transistors are substituted for said NMOS transistors.

4. The CMOS input buffer circuit as recited in claim 1, wherein said linearity improvement circuit of follower transistor comprises a capacitor C1 and M1 NMOS transistor, one end of said capacitor C1 is connected to the gate of M0 NMOS transistor, while the other end is connected to the gate of M1 NMOS transistor, the drain and source of M1 NMOS transistor are respectively connected to power supply and the drain of M0 NMOS transistor.

5. The CMOS input buffer circuit as recited in claim 1, wherein said linearity improvement circuit of follower transistor comprises a M4 PMOS (Positive channel MOS) transistor and M1 NMOS transistor, the gate and source of said M4 PMOS transistor are respectively connected to the drain and source of M0 NMOS transistor, the gate of M1 NMOS transistor is connected to bias voltage, the drain of M4 PMOS transistor is connected to power supply.

6. The CMOS input buffer circuit as recited in claim 5, wherein said NMOS transistors are replaced by PMOS transistors, whereas said PMOS transistors are replaced by NMOS transistors.

7. The CMOS input buffer circuit as recited in claim 1, wherein said current source load comprises a M3 NMOS transistor, the gate of M3 NMOS transistor is connected to bias voltage, while the source is grounded, the drain of M3 NMOS transistor is connected to the linearity improvement circuit of load impedance.

8. The CMOS input buffer circuit as recited in claim 1, wherein said linearity improvement circuit of load impedance comprises M2 NMOS transistor and an operational amplifier, the drain and source of said M2 NMOS transistor are respectively connected to the source of M0 NMOS transistor and the drain of M3 NMOS transistor, the input end of said operational amplifier is connected to the drain of M3 NMOS transistor, its output end is connected to the gate of M2 NMOS transistor.

9. The CMOS input buffer circuit as recited in claim 1, wherein said linearity improvement circuit of load impedance comprises M2 NMOS transistor and M4 NMOS transistor, the source of M2 NMOS transistor is connected to the drain of M4 NMOS transistor, the source of M4 NMOS transistor is connected to the drain of M3 NMOS transistor, the gates of M2 NMOS transistor and M4 NMOS transistor are connected to bias voltage.

\* \* \* \* \*